United States Patent [19]

Vig

[11] Patent Number: 4,741,076

[45] Date of Patent: May 3, 1988

[54] METHOD OF MAKING A HIGH STABILITY QUARTZ CRYSTAL OSCILLATOR

[75] Inventor: John R. Vig, Colts Neck, N.J.

[73] Assignee: The United States of America as represented by the Secretary of the Army, Washington, D.C.

[21] Appl. No.: 486,125

[22] Filed: Apr. 18, 1983

[51] Int. Cl.[4] .............................................. H01L 41/22
[52] U.S. Cl. .................................. 29/25.35; 310/315; 310/344; 310/361
[58] Field of Search ............... 29/25.35; 310/315, 341, 310/344, 361

[56] References Cited

U.S. PATENT DOCUMENTS 4,259,606  3/1981  Vig .................................. 310/344 X

Primary Examiner—Carl E. Hall
Attorney, Agent, or Firm—Sheldon Kanars; Roy E. Gordon

[57] ABSTRACT

A high stability quartz crystal oscillator is made from a quartz crystal plate by first cutting the quartz crystal plate at the angles that result in a resonator having a turnover temperature below the lowest operating temperature of the equipment in which the oscillator is to be used. A resonator is made from the quartz plate; the resonator when connected into a high stability oscillator circuit, and the oscillator-circuit/resonator combination placed into a temperature controlled environment where the temperature is maintained at a temperature between the lowest operating temperature of the equipment in which the oscillator is to be used to about −250° C.

10 Claims, No Drawings

METHOD OF MAKING A HIGH STABILITY QUARTZ CRYSTAL OSCILLATOR

The invention described herein may be manufactured, used and licensed by or for the Government for governmental purposes without the payment to me of any royalty thereon.

BACKGROUND OF THE INVENTION

This invention relates in general to a method of making a high stability quartz crystal oscillator and in particular to such a method wherein aging and short term instabilities are reduced.

It is known that the frequency versus temperature characteristic of a resonator is determined by the angles of cut of the resonator plate. Heretofore, in all high precision temperature controlled crystal oscillators, the resonator plate has been cut in such a manner as to insure that the resulting resonator's turnover temperature is at least 15° C. above the maximum operating temperature of the equipment in which the oscillator is to be used. Such a procedure is not satisfactory in some applications because the aging and short term instabilities (or noise) which occur at these higher temperatures make the oscillator unsuitable for the particular applications.

SUMMARY OF THE INVENTION

The general object of this invention is to provide a method of making a high stability quartz crystal oscillator. A more particular object of the invention is to provide such a method wherein aging and short term instabilities are reduced. A particular object of the invention is to provide a method of making a high stability quartz crystal oscillator suitable for use in a navigation receiver. Another object of the invention is to provide a method of making a high stability quartz oscillator suitable for use in a space vehicle.

It has now been found that the aforementioned objects can be attained by first making the high stability quartz crystal oscillator from a quartz crystal plate that has been cut at the angles that result in a resonator having a turnover temperature below the lowest operating temperature of the equipment in which the oscillator is to be used, then making a resonator from the cut quartz crystal plate, connecting the resonator into a high stability oscillator circuit, and then placing the oscillator-circuit/resonator combination into a temperature controlled environment wherein the temperature is maintained near the resonator turnover temperature which is at a temperature below the lowest operating temperature of the equipment in which the oscillator is to be used. The oscillator operating temperature range is in the range starting from the lowest operating temperature of the equipment in which the oscillator is to be used to about $-250°$ C. The higher the stability requirements on the oscillator, the lower the oscillator operating temperature.

DESCRIPTION OF THE PREFERRED EMBODIMENT

A high stability crystal oscillator is required for use in a navigation receiver. The receiver must be capable of operating in any environment, anyplace on earth, that is, over a temperature range of $-55°$ C. to $+85°$ C.

The particular quartz crystal plate selected for use in the crystal oscillator is a 5 MHz 3rd overtone SC cut crystal with angles of cut of $\phi=21°56'$ and $\sigma=35°43'$. These angles of cut result in a resonator with a turnover temperature of $-65°$ C. This resonator is incorporated into a high stability oscillator circuit and the oscillator-circuit/resonator combination then placed into a small closed cycle refrigerator maintained at $-70°$ C. The temperature of the resonator is maintained at $-65°$ C. by means of a heater and proportional control temperature control circuitry.

The whole assembly is then placed in the navigation receiver.

EXAMPLE 2

A high stability oscillator is required for use in a communications satellite. This oscillator must operate continuously and reliably for at least ten years, while maintaining as stable a frequency as possible. Although the stability requirements of this system could be met with an atomic frequency standard, a crystal oscillator is preferred because of the crystal oscillator's superior reliability, smaller size, and lower power consumption. The only drawback of crystal oscillators is that the long term stability f'crystal oscillators are typically much poorer than that of atomic frequency standards. This drawback is virtually eliminated in this application by means of a specially designed quartz crystal oscillator.

The particular quartz crystal plate selected for use in this crystal oscillator is a 2.0/MHz 5th overtone SC-cut plate with angles of cut of $\phi=21°56'$ and $\sigma=36°50'$. These angles of cut result in a resonator with a turnover temperature of $-100°$ C. The resonator plate is made of ultrahigh purity quartz, is 24 mm in diameter, and is contoured biconvex. The resonator plate is mounted into a ceramic flatpack enclosure and is thermocompression bonded to gold plated molybdenum mounting clips. The resonator is baked, plated with gold and is hermetically sealed at 300° C. in an ultraclean ultrahigh vacuum system at below $10^{-8}$ torr of pressure. The resulting resonator has a Q of $7.5\times10^6$. The resonator is connected to a high stability oscillator circuit and the resulting oscillator is placed into a high stability temperature controlled enclosure. The temperature of the enclosure is digitally controlled by using a second mode that is excited in the resonator at a 100 times lower drive level than the main mode. In the satellite environment, the temperature of the enclosure is stable to better than $\pm1\times10^{-4°}$ C. The temperature of the enclosure is set to within $1\times10^{-3°}$ C. of the resonator's turnover temperature. Once the oscillator is turned on, it is operated continuously.

After one year of continuous operation at $-100°$ C., the oscillator is found to have an aging rate that is below $5\times10^{-13}$ per day, and a short term stability for between 1 and 1000 seconds of averaging times of less than $5\times10^{-14}$.

In the foregoing examples, the quartz crystal plates are made into a resonator using established techniques that do not constitute part of this invention. These techniques generally involve mounting the crystal plates in crystal enclosure on mounting clips which are made of a metal, such as nickel. The mounting clips are designed to provide the proper mechanical support and good electrical and thermal contact to the crystal plate. The mounting supports also provide electrical contact to the crystal plate.

In the foregoing examples, the resonator is incorporated into a high stability oscillator circuit using art established techniques that do not constitute part of this invention. These techniques generally involve the methods described in the book "Design of Crystal and Other Harmonic Oscillators" by Benjamin Parzen, with Arthur Ballato, published by John Wiley and Sons, 1983.

In the foregoing examples, the temperature controlled environment can be conveniently maintained using a small refrigerated enclosure such as a small closed cycle refrigertor or a thermoelectrically cooled refrigerator. In a space vehicle the low temperature can be conveniently obtained by placing the oscillator into a portion of the vehicle that faces away from the sun and which portion is thermally insulated from the rest of the vehicle.

It is to believed that the method of the invention will reduce contamination effects by several orders of magnitude. This is because contaminant molecule's average lifetime on a surface depends especially on temperature. Thus, if a resonator is vacuum baked at 300° C. immediately prior to sealing, then any molecules that do not desorb from the surface at this 300° C. temperature will have lifetimes at −50° C. that are long enough not to have any affect on the resonator's aging.

Moreover, stress relief and diffusion rates are substantially reduced at low temperatures. Aging and noise of the oscillator and control circuitry are also slowed down at low temperatures.

Of course, the aging and noise mechanisms can be further reduced by operating at even lower temperatures. To attain the ultimate reduction in aging and noise, one may attempt to operate at as close to absolute zero in temperature as possible.

EXAMPLE 3

An ultrahigh stability frequency standard is required for a strategic communication system terminal that is to be incorporated into a tracked vehicle. The standard must be stable to $\pm 1 \times 10^{-11}$ per month. Due to the ruggedization, size, power consumption, reliability, and fast warmup requirements of the system, it is determined that a crystal oscillator would be preferred to an atomic standard if the stability requirement could be met.

The particular quartz plate selected for this application is a 5 MHz 5th overtone SC-cut plate with angles of cut of $\phi=21°56'$ and $\sigma=38°50'$. These angles of cut result in a resonator with a turnover temperature of −185° C. After the resonator is processed with state-of-the-art fabrication techniques, the resonator is connected to a high stability oscillator circuit, and the resulting oscillator is placed into a high stability temperature controlled enclosure that is cooled by means of a microminiature refrigerator which maintains the temperature of the oscillator at −185° C. The resulting oscillator package is found to meet the requirement of the communication system terminal.

I wish it to be understood that I do not desire to be limited to the exact details as described for obvious modifications will occur to a person skilled in the art.

What is claimed is:

1. Method of making a high stability quartz crystal oscillator from a quartz crystal plate, said method including the steps of
    (A) cutting the quartz crystal plate at the angles that result in a resonator having a turnover temperature below the lowest operating temperature of the equipment in which the oscillator is to be used,
    (B) fabricating a resonator from the cut quartz crystal plate,
    (C) connecting the resonator into a high stability oscillator circuit, and
    (D) placing the oscillator-circuit/resonator combination into a temperature controlled environment wherein the temperature is maintained at below the lowest operating temperature of the equipment in which the oscillator is to be used.

2. Method according to claim 1 wherein the quartz crystal resonator is an SC cut resonator with angles of cut of $\phi=21°56'$ and $\sigma=35°43'$ and a turnover temperature of −65° C.

3. Method according to claim 1 wherein the temperature controlled environment is maintained by a small refrigerated enclosure.

4. Method according to claim 3 wherein the small refrigerated enclosure is a closed cyle refrigerator.

5. Method according to claim 3 wherein the small refrigerated enclosure is a thermoelectrically cooled refrigerator.

6. Method according to claim 1 wherein the low temperature can be obtained in a space vehicle by placing the oscillator into a portion of the vehicle that faces away from the sun and which portion is thermally insulated from the rest of the vehicle.

7. Method according to claim 1 wherein the oscillator operating temperature range is in the range starting from the lowest operating temperature of the equipment in which the oscillator is to be used to about −250° C.

8. Method of making a high stability quartz crystal oscillator for use in a navigation receiver capable of operating any place on earth over a temperature range of −55° C. to +85° C. from an SC-cut quartz crystal plate, said method including the steps of
    (A) cutting the SC-cut quartz crystal plate with angles of cut of $\phi=21°56'$ and $\sigma=35°43'$,
    (B) fabricating a resonator from the cut quartz crystal plate,
    (C) connecting the resonator into a high stability oscillator circuit,
    (D) placing the oscillator-circuit/resonator combination into a closed cycle refrigerator maintained at −65° C., and
    (E) placing the whole assembly from step (D) into the naviagation receiver.

9. Method of making a high stability quartz crystal oscillator for use in a communications satellite capable of operating continuously and reliably for at least ten years while maintaining as stable a frequency as possible from an SC-cut quartz crystal plate said method including the steps of
    (A) cutting the SC-cut quartz crystal plate with angles of cut of $\phi=21°56'$ and $\sigma=36°50'$
    (B) fabricating a resonator from the cut quartz crystal plate,
    (C) connecting the resonator into a high stability oscillator circuit,
    (D) placing the oscillator circuit/resonator combination into a high stability temperature controlled enclosure maintained at about −100° C., and
    (E) placing the whole assembly from Step (D) into the communication satellite.

10. Method of making a high stability quartz crystal oscillator from an SC-cut quartz crystal plate wherein the oscillator is for use as an ultrahigh stability frequency standard for a strategic communications system terminal to be incorporated into a tracked vehicle and wherein the standard must be stable to $\pm 1\times 10^{-11}$ per month, said method including the steps of (A) cutting the SC-cut quartz crystal plate with angles of cut of $\phi=21°56'$ and $\sigma=38°50'$ (B) fabricating a resonator from the quartz crystal plate (C) connecting the resonator into a high stability oscillator circuit, (D) placing th oscillator-circuit/resonator combination into a microminiature refrigerator maintained at about $-185°$ C., and (E) placing the whole assembly from Step (D) into the tracked vehicle.

* * * * *